(12) United States Patent
Domoto et al.

(10) Patent No.: US 6,534,131 B1
(45) Date of Patent: Mar. 18, 2003

(54) METHOD FOR TREATING CARBON FILM, CARBON FILM AND COMPONENT WITH CARBON FILM

(75) Inventors: Yoichi Domoto, Ikoma (JP); Hiromasa Yagi, Nishinomiya (JP)

(73) Assignee: Sanyo Electric Co., Ltd., Moriguchi (JP)

(*) Notice: Subject to any disclaimer, the term of this patent is extended or adjusted under 35 U.S.C. 154(b) by 0 days.

(21) Appl. No.: 09/762,975

(22) PCT Filed: Jun. 19, 2000

(86) PCT No.: PCT/JP00/03999

§ 371 (c)(1), (2), (4) Date: Feb. 14, 2001

(87) PCT Pub. No.: WO00/79021

PCT Pub. Date: Dec. 28, 2000

(30) Foreign Application Priority Data

Jun. 18, 1999 (JP) ............................................. 11/172781

(51) Int. Cl.[7] ................................................. C23C 16/26
(52) U.S. Cl. ........................ 427/535; 427/577; 428/408
(58) Field of Search ................................. 427/535, 577; 428/408

(56) References Cited

U.S. PATENT DOCUMENTS 5,073,785 A * 12/1991 Jansen et al. .................. 347/45
5,695,565 A * 12/1997 Lee et al. ................. 118/723 E
5,770,467 A * 6/1998 Nishimura et al. .. 148/DIG. 100
6,066,399 A * 5/2000 Hirano et al. ............. 427/249.1

FOREIGN PATENT DOCUMENTS

| JP | 63221840 |   | 9/1988 |
| JP | 01138611 | * | 5/1989 |
| JP | 05208806 | * | 8/1993 |
| JP | 06341445 | * | 12/1994 |
| JP | 07277899 |   | 10/1995 |
| JP | 10152778 | * | 6/1998 |
| JP | 2000080473 |   | 3/2000 |

OTHER PUBLICATIONS

Park et al. Appl. Phys. Lett. 68 (25), Jun. 17, 1996, pp. 3594–3595.*

Miyake et al. Transactions of the ASME, 384, vol. 113, Apr. 1991, pp. 384–389.*

* cited by examiner

Primary Examiner—Timothy Meeks
(74) Attorney, Agent, or Firm—W. F. Fasse; W. G. Fasse

(57) ABSTRACT

A method for treating a carbon film comprising, in sequence, depositing a carbon film onto a substrate by a plasma CVD technique and exposing the carbon film at its surface to a gas plasma produced utilizing at least one type of gas selected from an Ar gas, $N_2$ gas, $H_2$ gas and F-containing gas so that the carbon film surface is modified.

13 Claims, 4 Drawing Sheets

(a) Conforming Article        (b) Defective

METHOD FOR TREATING CARBON FILM, CARBON FILM AND COMPONENT WITH CARBON FILM

TECHNICAL FIELD

The present invention relates to a carbonaceous or carbon film such as formed on a substrate and a treating method thereof, and more particularly to a carbon film which can be applied, for protective, insulative, surface modification or other purpose, to a variety of mechanical, chemical and electronic components that require the characteristics of high wear resistance and corrosion resistance, including electric shaver blades, compressor components, masks (screens) and squeegees for use in printing and surface acoustic wave devices, and to a method of treating thereof. The present invention also relates to a component with such a carbon film.

BACKGROUND ART

Carbon films, because of their excellent mechanical and chemical stabilities, have gained great expectations as coating materials. However, such carbon films exhibit higher affinity for water (less hydrophobic) at surfaces. This problematically permits easy adhesion but hard removal of dirt. Another problem has been encountered in components coated with a carbon film, i.e., they tend to be electrostatically charged as a result of easy generation of static charges at their sliding surfaces.

These have necessitated a treatment whereby the forming conditions of carbon films are varied or various materials are incorporated into films.

However, the practice of such treatments impairs their intrinsic mechanical and chemical properties, resulting in limiting the applicable field of carbon films.

The present inventors have found that the modification of a carbon film only at its surface permits improvements in hydrophobicity and electrical conductivity of the film surface without impairing intrinsic properties of the carbon film.

DISCLOSURE OF THE INVENTION

It is an object of the present invention to provide a method for treating a carbon film, which can modify surface properties of the film without impairing the characteristics of the carbon film.

The method for treating a carbon film in accordance with the present invention is characterized as comprising, in sequence, depositing a carbon film on a substrate by a plasma CVD technique and exposing a surface of the carbon film to a plasma so that the carbon film is modified at its surface.

In the present invention, the deposited carbon film is preferably exposed to the plasma produced utilizing at least one gas selected from an Ar gas, $N_2$ gas, $H_2$ gas and F-containing gas. The F-containing gas may be at least one selected from a $CF_4$ gas, $SF_6$ gas, $NF_3$ gas and $F_2$ gas.

Preferably, the deposited carbon film is exposed to a plasma produced using a B-containing gas and/or a P-containing gas, as well as to the above-described plasma.

During plasma exposure, a bias voltage may preferably be applied to one of the carbon film, the substrate having the carbon film deposited thereon and a substrate holder by which the substrate is held in position. Preferably, the bias voltage applied is a substantially negative voltage. More preferably, it is a negative voltage of at least −300 V, i.e. from below 0 V to −300 V.

In the present invention, deposition of a carbon film and the subsequent plasma exposure are preferably effected in the same apparatus.

Also in the present invention, a region of the carbon film that is modified by exposure to the plasma preferably extends to a depth of at most two thirds of its thickness.

The carbon film, as used herein, can be illustrated by amorphous carbon films, such as diamond-like carbon films, but may include a localized crystalline region.

The carbon film of the present invention is the carbon film characterized as having been treated by the treating method of the present invention.

The component of the present invention is the component having at its surface the carbon film treated by the treating method of the present invention. Examples of such components include a mask for use in screen printing, an inner or outer blade of an electric shaver, a stationary or rotary cylinder of a VTR and the like.

BEST MODE FOR CARRYING OUT THE INVENTION

Detailed description of the embodiments in accordance with the present invention is below given with reference to the drawings.

Figure 1:
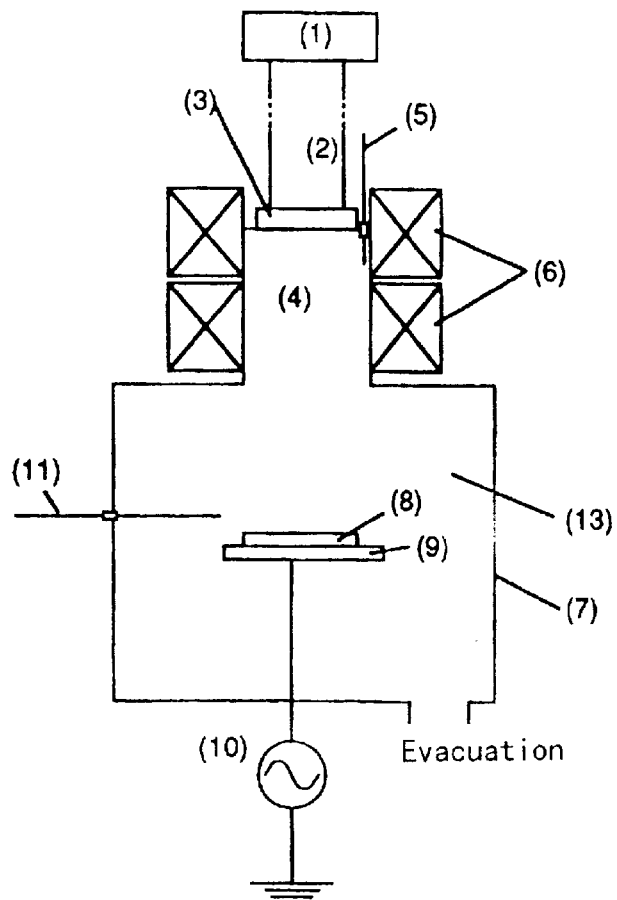
FIG. 1 is a construction representative of a film-forming apparatus for use in the formation of the carbon film of the present invention.

FIG. 1 is a construction representative of an apparatus for use in the formation of a carbon film of the present invention. As shown in the Figure, defined within an interior of a vacuum chamber 7 are a plasma generation chamber 4 and a reaction chamber 13 in which a substrate 8 is placed. A microwave generator 1 is connected to the plasma generation chamber 4 by a waveguide 2.

A microwave inlet window 3 is disposed at a joint of the waveguide 2 and the plasma generation chamber 4. The plasma generation chamber 4 is connected to a gas inlet line 5 through which a noble gas, such as an Ar gas, can be fed into the plasma generation chamber.

Also, a plurality of plasma magnetic field generators 6 are mounted circumferentially of the plasma generation chamber 14. A substrate holder 9 is placed within the reaction chamber 13 constituting the vacuum chamber 7. Connected to the reaction chamber is another gas inlet line 11 through which a material gas (reactive gas) consisting of a hydrocarbon gas, such as a $CH_4$ gas, can be introduced into the reaction chamber. Also, a radio-frequency power source 10 is connected to the substrate holder 9.

Utilizing the above-described apparatus, examples of the present invention are below described in detail.

(a. Carbon Film Formation Process)

First, the substrate 8 is attached onto the substrate holder 9. Thereafter, an interior of the vacuum chamber 7 is evacuated to a pressure of $10^{-5}$–$10^{-7}$ Torr. Then, an Ar gas, as a noble gas, is fed from the gas inlet line 5. Concurrently, a 2.45 GHz microwave at 100 W is supplied from the microwave generator 1, so that a plasma produced in the plasma generation chamber 4 is directed onto a surface of the substrate 8.

Further, a $CH_4$ gas, as a reaction gas, is supplied from the gas inlet line 11 at a constant flow rate of 100 sccm. The $CH_4$ gas fed from the gas inlet line 11 is activated by the action of the plasma so that it is converted to highly reactive ions and neutral active species for direction onto the substrate 8 surface.

Concurrently, the radio-frequency power source 10 applies a 13.56 MHZ RF power so that a self-bias voltage of −50 V is generated in the substrate 8.

As a result of the above-described process, a carbon film is deposited on the Si substrate to a thickness of about 2000 Å.

(b. Plasma Exposure Process)

The following explains a process of exposing the above-deposited carbon film to a plasma.

Following the formation of the carbon film on the Si substrate by the above-described process, an Ar, $N_2$, $H_2$ or $CF_4$ gas is introduced through the gas inlet line 5. At this time, a degree of vacuum within the vacuum chamber 7 is maintained at $2 \times 10^{-3}$ Torr. Further, a microwave generator 1 applies a microwave power at 200 W so that the introduced gas is converted to the form of a plasma and directed onto the substrate 8. Concurrently, the radio-frequency power source 10 applies a 13.56 MHZ RF power so that a self-bias voltage of −50 V is generated in the substrate 8. The substrate 8 is exposed to the plasma for 5 minutes.

Figure 2:
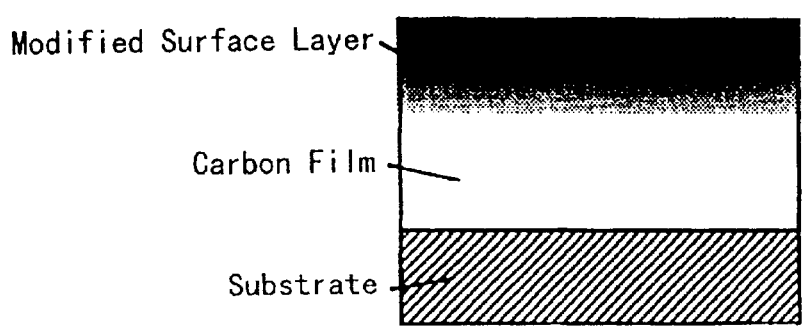
FIG. 2 is a sectional structure representative of the carbon film of the present invention.

FIG. 2 is a structure representative of the carbon film formed in the manner as described above. By exposure to the plasma, a surface portion of the carbon film on the substrate is modified to form a modified layer, as shown in the Figure.

(c. Evaluation of Hydrophobicity)

Figure 3:
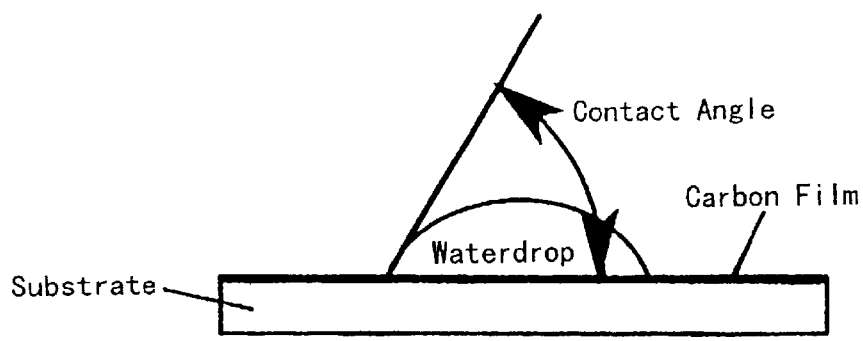
FIG. 3 is a schematic view, illustrating a technique of measuring a contact angle.

The substrate samples obtained via the above-described series of processes were evaluated for hydrophobicity. Evaluation of hydrophobicity was made by a contact angle which a drop of water assumed when placed in contact with the carbon film formed on each substrate surface, as shown in FIG. 3. Also, a contact angle of a substrate sample unexposed to the plasma was taken as a control to evaluate hydrophobicity by the variation in contact angle of each sample from the control.

The evaluation results are shown in Table 1, which demonstrate that each sample, when exposed to the plasma, exhibits the increased contact angle and thus the improved hydrophobicity at the film surface.

TABLE 1

| | Exposed to Ar Plasma | Exposed to $N_2$ Plasma | Exposed to $H_2$ Plasma | Exposed to $CF_4$ Plasma | Un-exposed |
|---|---|---|---|---|---|
| Contact Angle | +15°–+20° | +30°–+40° | +40°–+60° | +60°–+90° | — |

(d. Evaluation of Mechanical Properties)

Table 2 shows an abrasion depth of each carbon film of this example when subjected to a sliding test (sliding contact of a 300 g loaded alumina ball with a film surface). The results shown in the Table are generalized by taking an abrasion depth of the plasma-unexposed carbon film as 1.

TABLE 2

| | Exposed to Ar Plasma | Exposed to $N_2$ Plasma | Exposed to $H_2$ Plasma | Exposed to $CF_4$ Plasma | Un-exposed |
|---|---|---|---|---|---|
| Wear Depth | 1 | 0.95 | 0.9 | 0.95 | 1 |

As can be appreciated from this Table, the abrasion depth of the carbon film is maintained nearly constant even if its surface is exposed to the plasma. No significant change in abrasion resistance is observed.

Further, each sample was placed under hardness measurement by a Vickers hardness tester. All the samples were observed to exhibit high hardness, about 3,000 Hv. An inner region of each carbon film was found to remain unaffected by the plasma exposure.

Still further, a friction resistance of each sample was measured during the sliding test and its ratio to the load was calculated to evaluate a coefficient of kinetic friction for the sample. The results are shown in Table 3, which are generalized by taking a kinetic friction coefficient of the plasma-unexposed carbon film as 1.

TABLE 3

| | Exposed to Ar Plasma | Exposed to $N_2$ Plasma | Exposed to $H_2$ Plasma | Exposed to $CF_4$ Plasma | Un-exposed |
|---|---|---|---|---|---|
| Coefficient of Kinetic Friction | 0.9 | 0.85 | 0.8 | 0.7 | 1 |

As demonstrated by the results, the carbon films, when exposed to the plasma, exhibit the reduced kinetic friction coefficients and thus have the improved sliding properties compared to the plasma-unexposed carbon film.

As such, it has been found that the plasma exposure is effective in improving sliding properties of a carbon film surface while maintaining superior mechanical properties of the carbon film as a whole.

(e. Evaluation of Electrical Properties)

Figure 4:
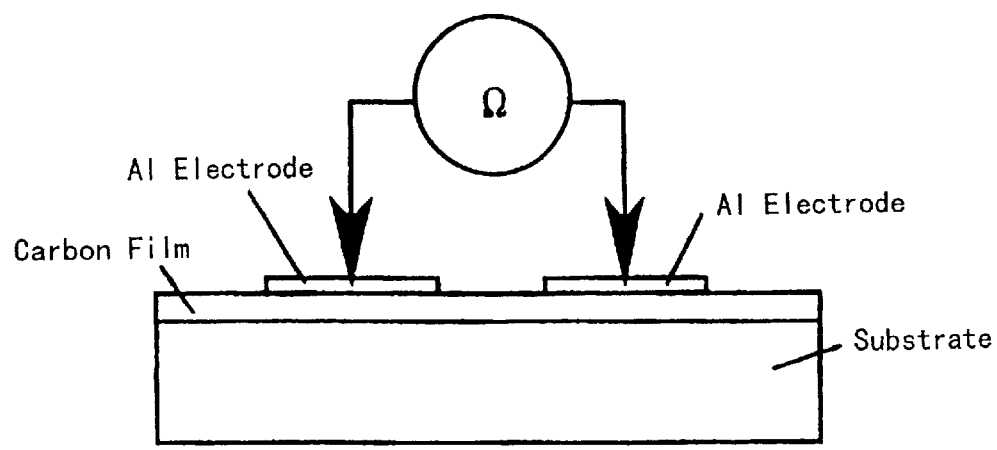
FIG. 4 is a schematic view, illustrating a technique of measuring an electric resistance.

A pair of Al electrodes was vapor deposited on a carbon film of each sample, as shown in FIG. 4, to evaluate an electrical conductivity therebetween (based on measurements of resistance). The results are shown in Table 4, with the given data being generalized by taking an electrical conductivity of the plasma-unexposed carbon film as 1.

TABLE 4

| | Exposed to Ar Plasma | Exposed to $N_2$ Plasma | Exposed to $H_2$ Plasma | Exposed to $CF_4$ Plasma | Un-exposed |
|---|---|---|---|---|---|
| Conductivity | $1 \times 10^5$ | $1 \times 10^4$ | $1 \times 10^4$ | $1 \times 10^4$ | 1 |

The results show that when a carbon film is exposed at its surface to the plasma, its electrical conductivity value adds four or five digits.

Further, a 20% by partial pressure of $B_2H_6$ or $PH_3$ gas was mixed in an Ar gas plasma during the plasma exposure process to fabricate samples which were subsequently evaluated for electrical conductivity in the same manner as described above. The results are shown in Table 5.

TABLE 5

|  | Exposed to (Ar + $B_2H_6$) Plasma | Exposed to (Ar + $PH_3$) Plasma |
|---|---|---|
| Conductivity | $1 \times 10^7$ | $1 \times 10^7$ |

The addition of such a gas was found to further improve the electrical conductivity of a carbon film. These results show that the electrical conductivity of a carbon film can be significantly increased when its surface is exposed to a plasma.

The above-described various effects of plasma exposure are considered to result from adsorption of various gas molecules and atoms onto a carbon film surface, reduction of an adsorption water at the surface, change in arrangement of carbon atoms at the surface, or interstitial doping of B or P into the film. In either case, mechanical and electrical properties of a carbon film can be improved by exposure of its surface to a plasma.

(f. Study of a Suitable Bias Voltage)

Next, the effect of the bias voltage to be applied to the substrate in (b. Plasma Exposure Process) was studied. First, substrate samples were fabricated in the same manner as in (a. Carbon Film Formation Process). An $N_2$ gas was used. Exposure time was 2 minutes. The bias voltage applied to the substrate was varied within the range of 0–-500 V to fabricate 8 substrate samples in total, as shown in Table 6. In Table 6, the contact angle of each sample is indicated by a variation from a standard contact angle value measured for the plasma-unexposed sample. Also, the film thickness of each sample is indicated by a decrease from a standard film thickness measured for the plasma-unexposed sample. The process temperature indicates a substrate temperature.

TABLE 6

|  | 0V | −50V | −100V | −150V | −200V | −300V | −400V | −500V |
|---|---|---|---|---|---|---|---|---|
| Contact Angle | +25° | +40° | +40° | +35° | +30° | +30° | — | — |
| Film Thickness Reduction | Approximately 0 | About 200 Å | About 500 Å | About 700 Å | About 1000 Å | About 1500 Å | Substrate Exposed | Substrate Exposed |
| Process Temperature | 30° C. | 50° C. | 70° C. | 100° C. | 150° C. | 200° C. | 300° C. | 350° C. |

Regardless of the condition used, the sample exhibited the increased contact angle compared to the plasma-unexposed sample and thus the improved hydrophobicity. However, in either condition, the sample was sputter etched to show reduction in its film thickness. Particularly, application of the bias voltage at −400 V or −500 V resulted in the absence of carbon film and the exposure of the substrates to outside, which was regarded as practically unacceptable.

Also, the process temperature measured during plasma exposure was found to increase with the decreasing bias voltage. Considering the thermal effect on a substrate on which a film is formed, the process may preferably be performed under a temperature condition of not exceeding 200° C., more preferably of not exceeding 100° C.

These results show that the applied bias voltage is preferably controlled at a value of not below −300 V, more preferably of not below −150 V.

It was confirmed that the effects of plasma exposure, such as an increase of a contact angle, diminished due mostly to the adsorption of ambient oxygen or moisture onto a carbon film surface, when a substrate was, subsequent to deposition of the carbon film thereon, once taken out from the apparatus to expose the carbon film surface to ambient and again back to the apparatus where the carbon film surface was exposed to a plasma. Preferably, the plasma exposure step follows the carbon film deposition step without intermission.

Further, if a deeper region of a carbon film is modified by plasma exposure, the properties which the carbon film prior to being modified has originally possessed may be subjected to changes. Preferably, a thickness of a modified layer is properly controlled. In view of necessary hardness and wear resistance of a carbon film, at least one third of its thickness preferably maintains its original structure.

(g. Application of a Carbon Film of the Present Invention to Inner and Outer Blades of an (Electric) Shaver).

The same procedure as described in (a. Formation Process of a Carbon Film) was utilized to deposit a 2,000 Å thick carbon film both on a back surface (i.e., a surface brought into sliding contact with an inner blade) of an Ni outer blade and on an SUS inner blade of a shaver. Then, each carbon film was exposed to an $N_2$ plasma for 5 minutes according to the procedure described in (b. Plasma Exposure Process). Deposition of the carbon film and exposure thereof to the plasma were serially achieved in the same apparatus.

Prior to the deposition of the carbon film, a 300 Å thick Si film was previously deposited on the outer and inner blades to improve adherence of the carbon film to the substrate. Also, prior to the deposition of the Si film, an edge of the inner blade was previously polished to define an irregularities patterned in a stripe on its surface.

The above-fabricated sample was attached to a shaver body and subjected to a monitor use test over a month. For comparative purposes, the similar test was conducted using a shaver which carried inner and outer blades uncoated with a carbon film and a shaver which carried inner and outer blades coated with a plasma-unexposed carbon film.

After the test, a clear abrasion pattern appeared on the back surface of the outer blade that excluded a coating of carbon film. In contrast, the carbon film-coated blades, either exposed or unexposed to the plasma, showed no track of scratch.

The absence of the carbon film caused wear on the inner blade edge. Also, the striped irregular pattern defined thereon by polishing before the test almost disappeared. In contrast, in the presence of the carbon film either exposed or unexposed to the plasma, the striped irregular pattern on the inner blade edge remained as before the test.

After the test, the inner blade having the plasma-exposed carbon film thereon was observed to carry on its surface a thin deposit of dirt which was found to be readily removable by brushing. On the other hand, the inner blade having the plasma-unexposed carbon film thereon was observed to carry on its surface a thick deposit of dirt. Removal of such dirt therefrom was found possible by brushing but more difficult than from the inner blade having the plasma-exposed carbon film. Brushing was found insufficient to remove dirt in a satisfactory manner from the inner blade uncoated with the carbon film. Cleaning in a detergent was required.

These results demonstrate that simultaneous improvement of wear resistance and cleanability of a substrate can be achieved by the provision of a carbon film thereon, in particular, of a carbon film exposed at its surface to a plasma.

(h. Application of a Carbon Film of the Present Invention to a Mask for Use in Screen Printing)

The same procedure as described in (a. Formation Process of a Carbon Film) was utilized to deposit a 2,000 Å thick carbon film on a mask made of Ni. The carbon film was subsequently exposed to a $CF_4$ gas plasma for 5 minutes in the same manner as described in (b. Plasma Exposure Process). Deposition of the carbon film and exposure of its surface to the plasma were serially effected in the same apparatus. Prior to the deposition of the carbon film, a 500 Å thick Si film was deposited on a substrate (mask) to improve adherence of the carbon film to the substrate.

Figure 5:
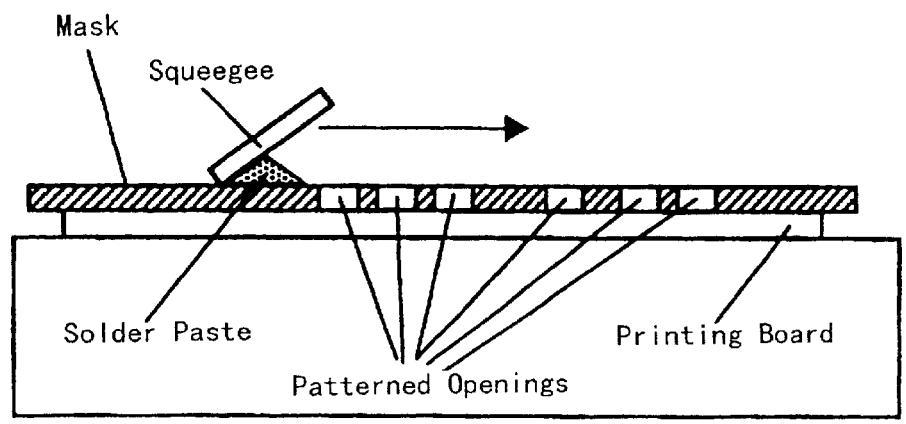
FIG. 5 is a schematic view, illustrating a carbon film of the present invention as applied to screen printing.

FIG. 5 is a schematic view, illustrating a carbon film of the present invention as applied to screen printing. In this example, an open pattern was previously formed in the mask. Using such a mask, a printing test of a solder paste onto a printing board was conducted. Printing was performed by applying the solder paste onto the mask and spreading the paste with the aid of an urethane squeegee to lead it into the open pattern. For comparative purposes, the similar printing test was carried out using a mask uncoated with a carbon film and a mask coated with a plasma-unexposed carbon film.

Without a coating of carbon film, the mask showed an increasing trend of wear with the repeated sliding action of the squeegee. In contrast, with a coating of carbon film, either exposed or unexposed to the plasma, the mask showed no track of scratch even after printing was repeated 100,000 times. In addition, wear of the squeegee itself diminished significantly.

Figure 6:
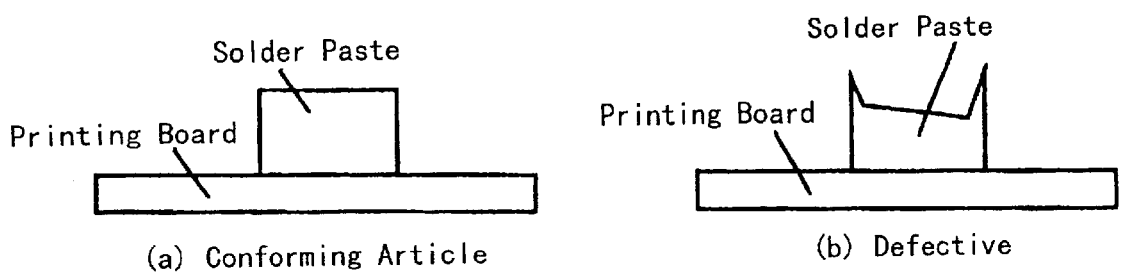
FIG. 6 is a side view, illustrating the configuration of a printed solder paste.

Still further, a sectional profile of the printed solder pattern on the board was observed. After repetitive printing operations using the mask either uncoated with a carbon film or coated with the plasma-unexposed carbon film, "projections" were formed at edges of the resulting printed pattern, as shown in FIG. 6($b$). This is a phenomenon resulting from adhesion of the solder paste to inner walls of patterned openings.

In contrast, with the use of the mask coated with the plasma-exposed carbon film, the resulting printed pattern was observed to carry no "projection" and exactly reproduce the open pattern of the mask, as shown in FIG. 6($a$). This is considered due to high oil repellency of a carbon film coated on inner walls of patterned openings and modified at its surface by exposure to the plasma, which facilitated removal of the solder paste from the patterned openings.

After the above test, releasability of the solder paste from the mask was observed. Little solder was observed to deposit or remain on the mask with the carbon film exposed at its surface to the plasma, confirming its satisfactory maintenance properties.

(i. Application of a Carbon Film of the Present Invention to a VTR Cylinder)

The same procedure as described in (a. Formation Process of a Carbon Film) was utilized to deposit a 2,000 Å thick carbon film on a tape sliding surface of a rotary cylinder composed of an Al alloy for incorporation into a VTR (videotape recorder). Thereafter, the carbon film was exposed to an Ar gas plasma for 5 minutes in the same manner as described in (b. Plasma Exposure Process). Deposition of the carbon film and exposure of its surface to the plasma were serially effected in the same apparatus. Prior to deposition of the carbon film, a 500 Å thick Si film was deposited on the cylinder to improve adherence of the carbon film to the cylinder.

Figure 7:
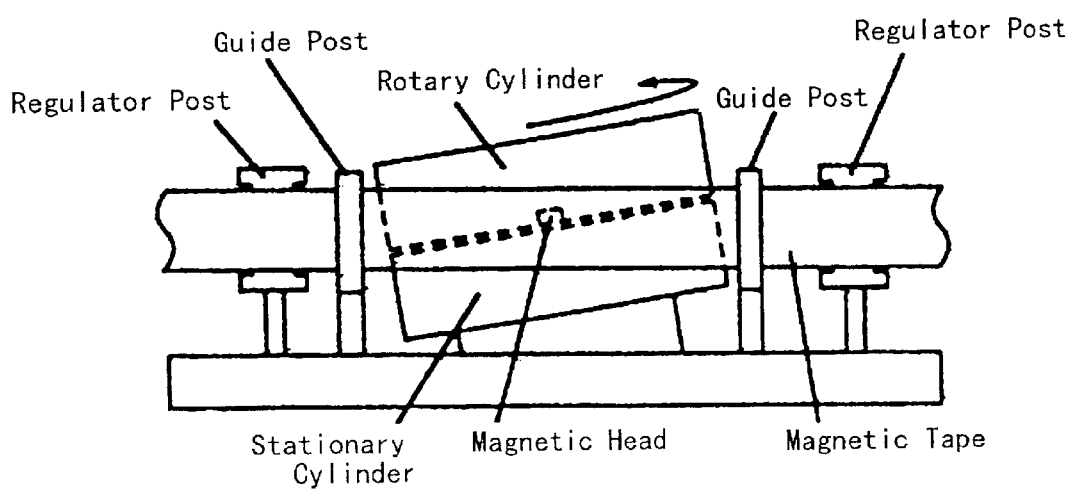
FIG. 7 is a side view, illustrating a VTR cylinder to which a carbon film of the present invention is applied.

Using the above-fabricated cylinder, a videotape transport test was conducted. FIG. 7 is a construction representative of a cylinder and a tape transport mechanism of a VTR.

For comparative purposes, a rotary cylinder uncoated with a carbon film and a rotary cylinder coated with a plasma-unexposed carbon film were fabricated and then subjected to the similar test.

For a VTR incorporating the rotary cylinder uncoated with a carbon film, an abrasion pattern appeared on a surface of the rotary cylinder, scratches on both a tape and a rotary head surface and slight noises on reproduced images, as tape transport continued.

In contrast, for a VTR incorporating the rotary cylinder coated with a carbon film, either exposed or unexposed to the plasma, no scratch was observed on the rotary cylinder surface, tape and rotary head.

However, for the VTR incorporating the rotary cylinder coated with the plasma-unexposed carbon film, electrostatic charges were produced by a sliding action of the tape and caused noises on reproduced images. Also, the transport of the tape was caused to stop by winding of the tape. On the other hand, for the VTR incorporating the rotary cylinder coated with the plasma-exposed carbon film, the generation of electrostatic charges was not observed. Noises did not appear nor did the winding of tape occur. The tape was transported in an extremely smooth fashion.

In the above example, a carbon film was deposited onto the tape sliding surface of rotary cylinder only and exposed to the plasma. It is more effective if a carbon film is additionally deposited onto a tape sliding surface of a stationary cylinder and exposed to the plasma.

In the preceding description, the bias voltage may be applied in the form of a direct current, pulsed or controlled modulation voltage. Either form is satisfactory, so long as it provides a substantially negative voltage.

The plasma source used to treat a carbon film may be different from that used to form the carbon film.

In the plasma exposure, another type of F-containing gas, such as an $SF_6$, $NF_3$ or $F_2$ gas, may be used instead of the $CF_4$ gas.

When necessary, only a portion of a carbon film surface may be plasma treated according to the present invention.

Further, the carbon film may also contain, over its entire region, an element other than the primary constituent elements, carbon and hydrogen.

Still further, an interlayer may be provided between a carbon film and a substrate.

The effects of the present invention are based on the change (modification) of a carbon film surface when treated with a plasma. It is therefore preferred that the carbon film has an amorphous structure. However, the carbon film may have a localized crystalline region.

The present invention is also applicable to other parts or components which require good cleanability or antistatic properties, in addition to substrate surface protection.

The present invention is further applicable to glasses or lenses by utilizing a translucent carbon film.

Utility in Industry

The present invention can improve mechanical properties (e.g., hydrophobicity, wear resistance and coefficient of kinetic friction) and electrical properties (e.g., electrical conductivity) of carbon films.

What is claimed is:

1. A method for treating a carbon film characterized as comprising, in sequence, depositing a carbon film onto a substrate by a plasma CVD technique and exposing a carbon film surface of said carbon film to a gas plasma so that said carbon film surface is modified, wherein said gas plasma is produced using $N_2$ gas.

2. The method for treating a carbon film as recited in claim 1, characterized that a bias voltage is applied to one of said carbon film, said substrate carrying the carbon film thereon and a substrate holder retaining the substrate while the substrate is exposed to the plasma.

3. The method for treating a carbon film as recited in claims characterized that said bias voltage is a substantially negative voltage.

4. The method for treating a carbon film as recited in claim 3, characterized that said bias voltage is a negative voltage in a range from below 0 V to −300 V.

5. The method for treating a carbon film as recited in claim 1, characterized that said depositing of said carbon film and the subsequent exposing of said carbon film surface to said gas plasma are continuously effected in the same apparatus.

6. The method for treating a carbon film as recited in claim 1, characterized that said carbon film is an amorphous carbon film.

7. The method for treating a carbon film as recited in claim 1, characterized that said carbon film includes a localized crystalline region.

8. The method for treating a carbon film as recited in claim 1, characterized that said carbon film surface is additionally exposed to a B-containing gas plasma and/or a P-containing gas plasma, as well as to said gas plasma.

9. The method for treating a carbon film as recited in claim 1, characterized that a region of the carbon film that is modified by exposure to the plasma extends to a depth of at most two thirds of its thickness.

10. An article comprising a substrate and arranged thereon a carbon film characterized as having been treated according to the treating method as recited in claim 1.

11. The article as recited in claim 10, characterized as being a mask for use in screen printing.

12. The article as recited in claim 10, characterized as being an inner or outer blade of a shaver.

13. The article as recited in claim 10, characterized as being a stationary or rotary cylinder of a VTR.

* * * * *

UNITED STATES PATENT AND TRADEMARK OFFICE
CERTIFICATE OF CORRECTION

PATENT NO.    : 6,534,131 B1
DATED         : March 18, 2003
INVENTOR(S)   : Domoto et al.

It is certified that error appears in the above-identified patent and that said Letters Patent is hereby corrected as shown below:

<u>Column 9,</u>
Line 17, before "characterized", replace "claims" by -- claim 2 --.

Signed and Sealed this

Twenty-ninth Day of July, 2003

JAMES E. ROGAN
*Director of the United States Patent and Trademark Office*